United States Patent
Decrock et al.

(10) Patent No.: US 11,317,547 B2
(45) Date of Patent: Apr. 26, 2022

(54) SHIELDING HOUSING FOR A DETACHABLE FULLY SHIELDED INTERNAL CABLE ASSEMBLY

(71) Applicants: TE Connectivity Belgium BVBA, Oostkamp (BE); Tyco Electronics Svenska AB, Upplands Väsby (SE); TE Connectivity Corporation, Berwyn, PA (US)

(72) Inventors: Lieven Decrock, Roeselare (BE); Rickard Valentin Barrefelt, Stockholm (SE); Dustin Rowe, Harrisburg, PA (US); Yublia May, Hershey, PA (US); Kylie Elizabeth Hostrander, Hershey, PA (US); Richard James Long, Columbia, PA (US); Julia Anne Lachman, York, PA (US); Jacob Rita, Lancaster, PA (US); Charles Jameson Valentine, Lancaster, PA (US); Magnus Andersson, Järfälla (SE)

(73) Assignees: TE Connectivity Services GmbH, Schaffhausen (CH); TE Connectivity Belgium BVBA, Oostkamp (BE); TE Electronics Svenska AB, Upplands-Vasby (SE)

( * ) Notice: Subject to any disclaimer, the term of this patent is extended or adjusted under 35 U.S.C. 154(b) by 0 days.

(21) Appl. No.: 16/992,598

(22) Filed: Aug. 13, 2020

(65) Prior Publication Data
US 2021/0051824 A1     Feb. 18, 2021

(30) Foreign Application Priority Data
Aug. 16, 2019   (EP) ..................... 19192082

(51) Int. Cl.
  *H05K 9/00*     (2006.01)
  *H01R 13/6583*  (2011.01)

(52) U.S. Cl.
  CPC ....... *H05K 9/0009* (2013.01); *H01R 13/6583* (2013.01); *H05K 9/0084* (2013.01)

(58) Field of Classification Search
  CPC ..................... H05K 9/0016; H01R 13/6583
  See application file for complete search history.

(56) References Cited

U.S. PATENT DOCUMENTS

| 2014/0030922 A1* | 1/2014 | Schmitt ............ H01R 13/6587 439/607.2 |
| 2016/0056553 A1* | 2/2016 | Brubaker ............ H01R 12/727 439/78 |
| 2017/0077643 A1 | 3/2017 | Zbinden et al. |

FOREIGN PATENT DOCUMENTS

WO    2016151562 A1    9/2016

* cited by examiner

*Primary Examiner* — Hung V Ngo
(74) *Attorney, Agent, or Firm* — Barley Snyder

(57) ABSTRACT

A shielding housing includes a receptacle configured to receive an electrical connector assembly including an electrical connector and a mating connector connected to the electrical connector. The receptacle is formed as a straight passage with an opening at each end of the straight passage. Either end of the straight passage receives one of the electrical connector and the mating connector along a mating axis coaxial with the straight passage.

21 Claims, 12 Drawing Sheets

SHIELDING HOUSING FOR A DETACHABLE FULLY SHIELDED INTERNAL CABLE ASSEMBLY

CROSS-REFERENCE TO RELATED APPLICATION

This application claims the benefit of the filing date under 35 U.S.C. § 119(a)-(d) of European Patent Application No. 19192082.6, filed on Aug. 16, 2019.

FIELD OF THE INVENTION

The present invention relates to an internal cable assembly and, more particularly, to a shielding housing for a detachable fully shielded internal cable assembly.

BACKGROUND

Data transmission between separate systems (e.g. two separate electrical devices and/or two separate circuit boards of the same electrical device) is necessary in many applications of the telecommunication industry. In the prior art, such data transmission is realized by providing a receptacle (e.g. small formfactor pluggable (SFP) board connector) for an external plug (e.g. SFP plug) on the edge of a circuit board to where an external cable can be connected. The data is transmitted to and from an external transceiver through the external cable and via conductive tracks, which are positioned on the circuit board and connect the receptacle with the according elements on the circuit board for which the data transmission is intended. However, the data transmission via the conductive tracks of the circuit board is prone to transmission losses and limited in its transmission rate.

In applications where high-speed data transmission is required, a bypass connection can be used. Through a suitable internal cable assembly, the bypass connection directly connects the receptacle to the corresponding elements on the circuit board for which the high-speed data transmission is intended. The internal cable assembly comprises a separate over-the-board cable which runs over the circuit board, and is therefore independent from the conductive tracks of the circuit board. Thus, the transmitted data is not routed via the conductive tracks of the circuit board, which impose a limitation on the transmission rate. Yet such an internal cable assembly of the bypass connection is prone to cross-talk.

SUMMARY

A shielding housing includes a receptacle configured to receive an electrical connector assembly including an electrical connector and a mating connector connected to the electrical connector. The receptacle is formed as a straight passage with an opening at each end of the straight passage. Either end of the straight passage receives one of the electrical connector and the mating connector along a mating axis coaxial with the straight passage.

BRIEF DESCRIPTION OF THE DRAWINGS

The invention will now be described by way of example with reference to the accompanying Figures, of which.

DETAILED DESCRIPTION OF THE EMBODIMENT(S)

Figure 1:
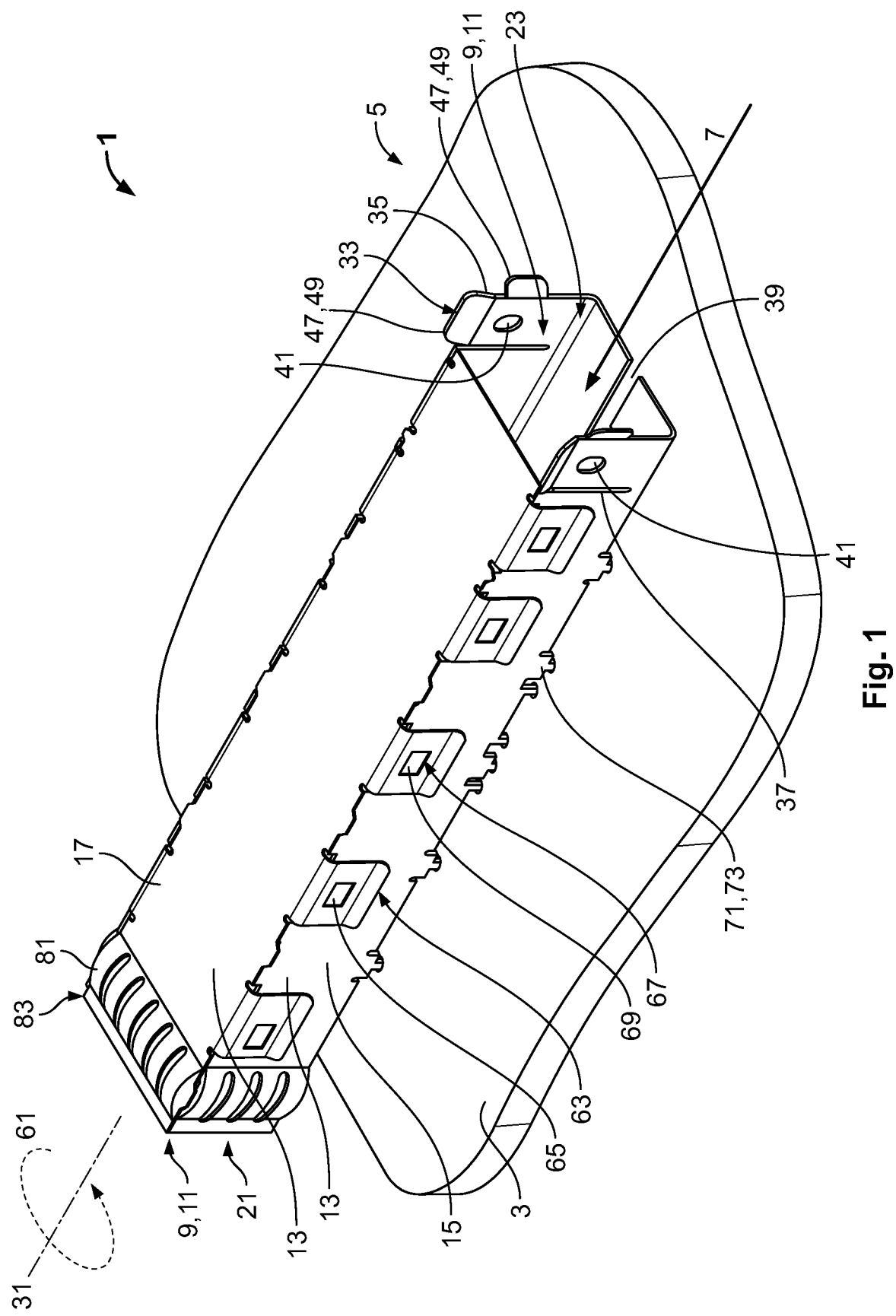
FIG. 1 is a perspective view of a shielding housing according to an embodiment.

In the following, exemplary embodiments of the invention are described with reference to the drawings. The shown and described embodiments serve explanatory purposes only. The combination of features shown in the embodiments may be changed. For example, a feature which is not shown in an embodiment but described herein may be added if the technical effect associated with this feature is beneficial for a particular application. Vice versa, a feature shown as part of an embodiment may be omitted if the technical effect associated with this feature is not needed in a particular application. In the drawings, elements that correspond to each other with respect to function and/or structure have been provided with the same reference numeral.

A structure of a shielding housing 1 is explained with reference to the exemplary embodiments shown in FIGS. 1-12.

FIG. 1 shows a perspective view of the shielding housing 1 according to the present disclosure, the shielding housing 1 being attached to a printed circuit board (PCB) 3 in such a way that it extends at least partially over the outer edge of the PCB 3. The shielding housing 1 comprises a receptacle 5, wherein the receptacle 5 is formed as a straight passage 7 with openings 9 at both ends 11.

Figure 2:
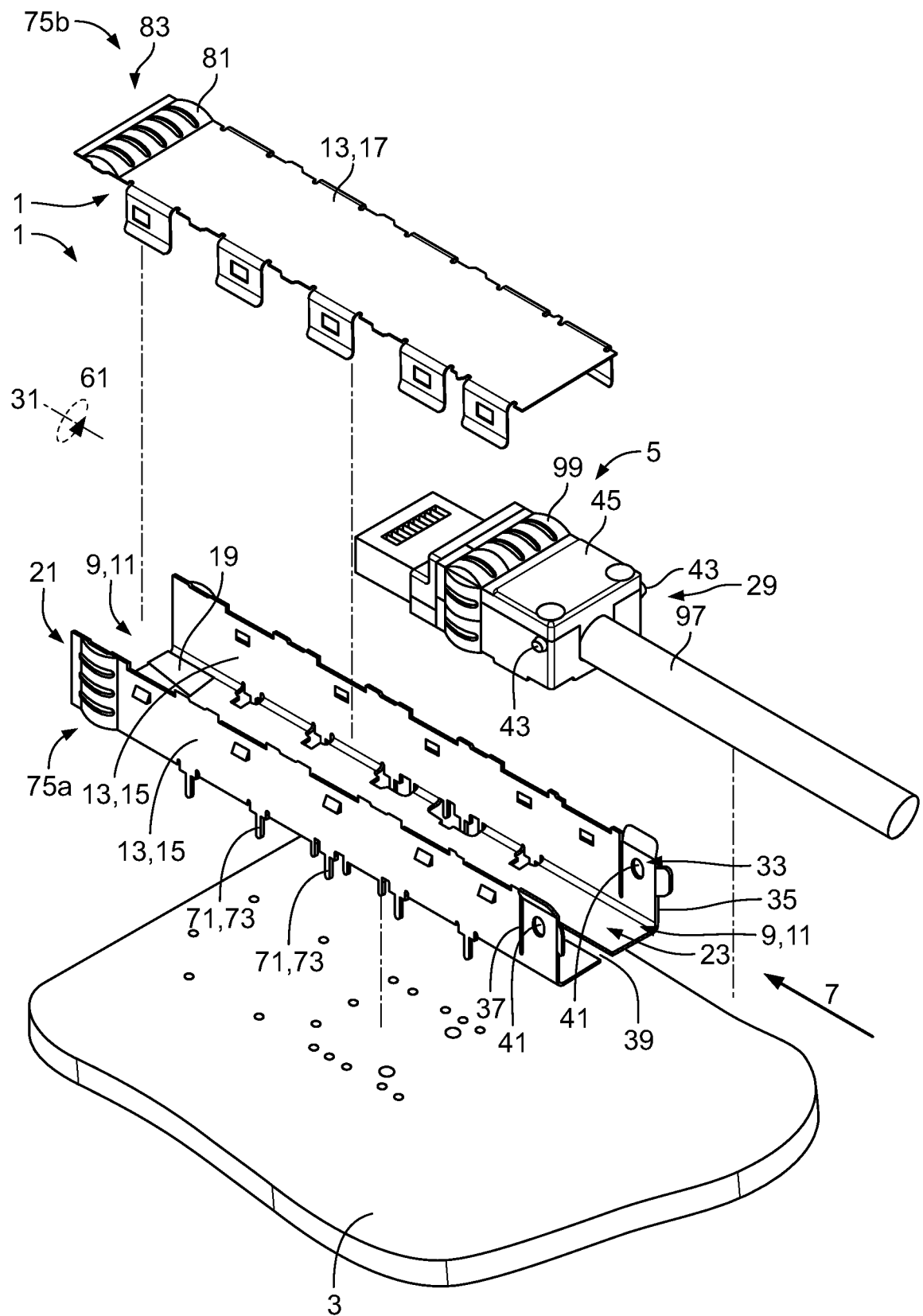
FIG. 2 is an exploded perspective view of a shielding housing and a mating connector according to another embodiment.
Figure 8:
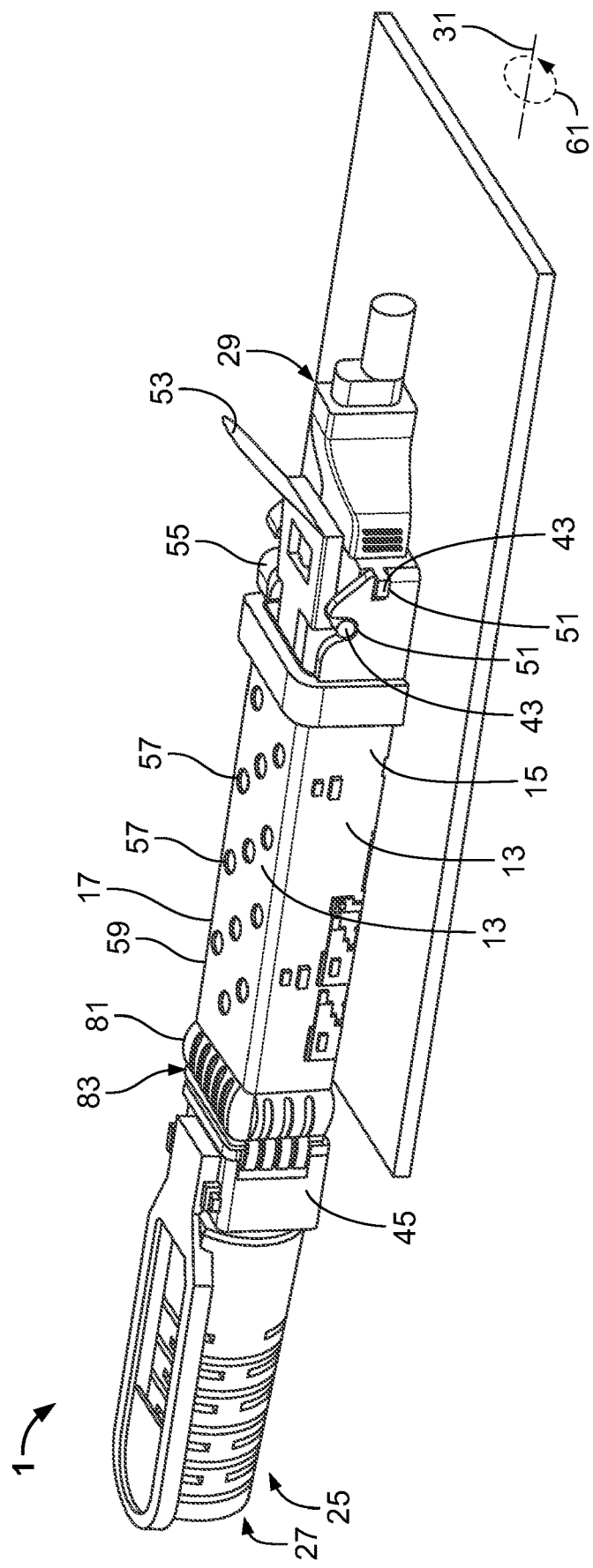
FIG. 8 is a perspective view of the shielding housing of FIG. 6 with a mating connector and an electrical connector.

As shown in FIGS. 1 and 2, the receptacle 5 may comprise at least four substantially rectangular shaped walls 13. Two of the at least four walls 13 may be spaced apart and aligned parallel to each other in a direction perpendicular to the PCB 3 to form two sidewalls 15 of the shielding housing 1. The other two of the at least four walls 13 may be spaced apart and aligned parallel to each other in a direction perpendicular to the two sidewalls 15 to form a top wall 17 and a bottom wall 19 of the shielding housing 1, respectively. All of the at least four walls 13 enclose the straight passage 7, wherein on each end 11 of the enclosed straight passage 7, one of the two openings 9 is positioned forming a front end 21 and a back end 23 of the shielding housing 1. The front end 21 is configured for receiving an electrical connector 25 of an electrical connector assembly 27, as shown in FIG. 8. The back end 23 is configured for receiving a mating connector 29 for the electrical connector 25, shown in FIG. 2. In an embodiment, the electrical connector 25 is a high-speed electrical connector.

A mating axis 31, as shown in FIGS. 1 and 2, runs coaxially with the straight passage 7 and represents the direction along which the electrical connector 25 and the mating connector 29 are received by the front end 21 and the back end 23, respectively. The lengths of the straight passage 7 along the mating axis 31 is configured in such a way that the electrical connector 25 and the mating connector 29 are matable within the receptacle 5, if the electrical connector 25 and the mating connector 29 are received by the front end 21 and the back end 23, respectively.

As shown in FIGS. 1-10, the receptacle 5 may comprise a locking mechanism 33, which is arranged adjacently to and/or as a part of the front end 21 and/or the back end 23. In the shown embodiment of FIGS. 1-3, one locking mechanism 33 is formed by a substantially U-shaped projection 35, which protrudes away from the back end 23 along the mating axis 31. The locking mechanism 33 may be separated from the sidewalls 15 through slits 37, which extend along a direction perpendicular to the mating axis 31. Another slit 39, which extends along a direction parallel to the mating axis 31, may separate the locking mechanism 33 into two halves. Each of the two halves may comprise at least one hole of at least one pair of holes 41. Each hole of the at least one pair of holes 41 may be configured to receive a corresponding knob 43, which is positioned on the outside of a backshell 45 of the mating connector 29.

Figure 3:
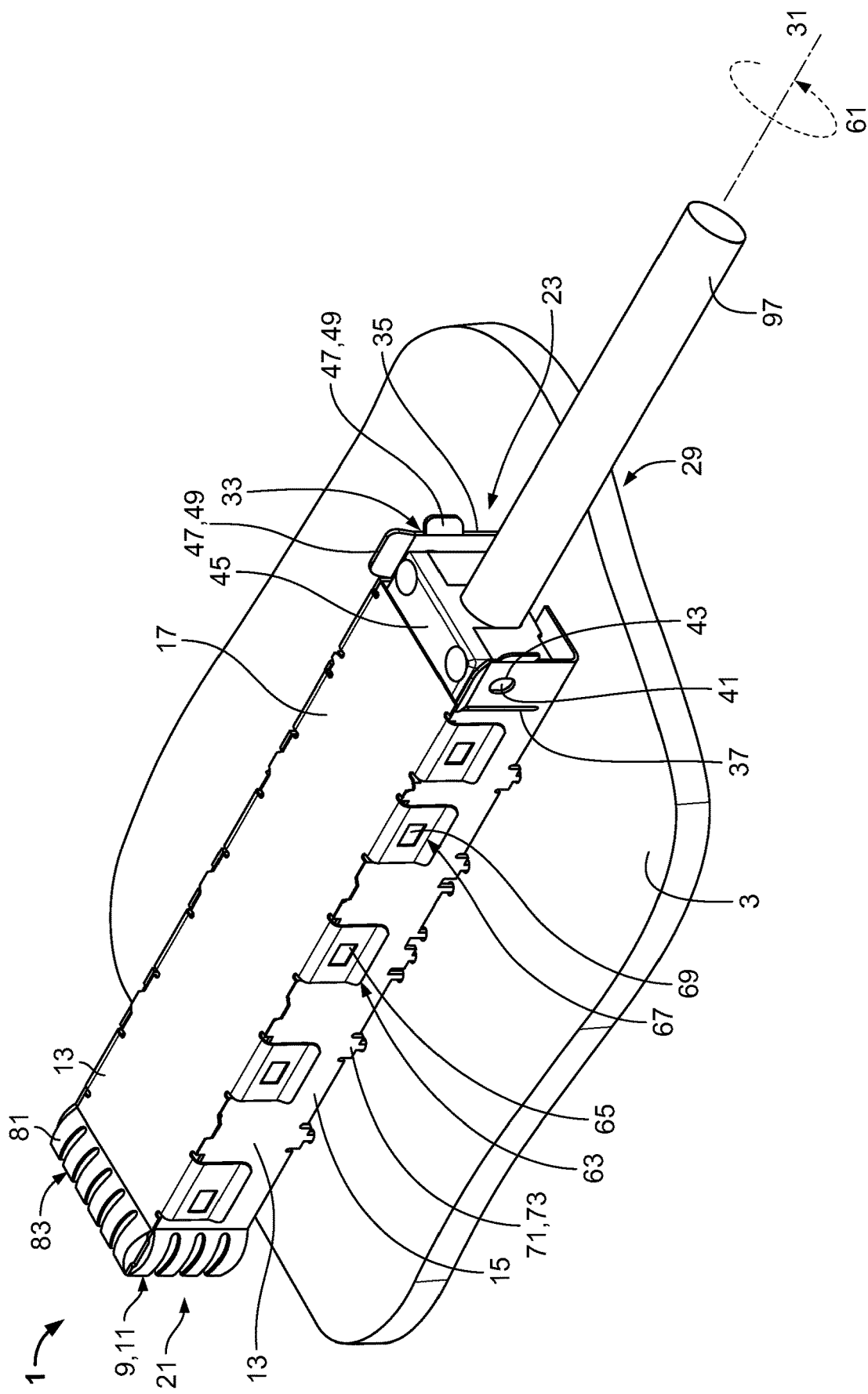
FIG. 3 is a perspective view of the shielding housing and the mating connector of FIG. 2.
Figure 5:
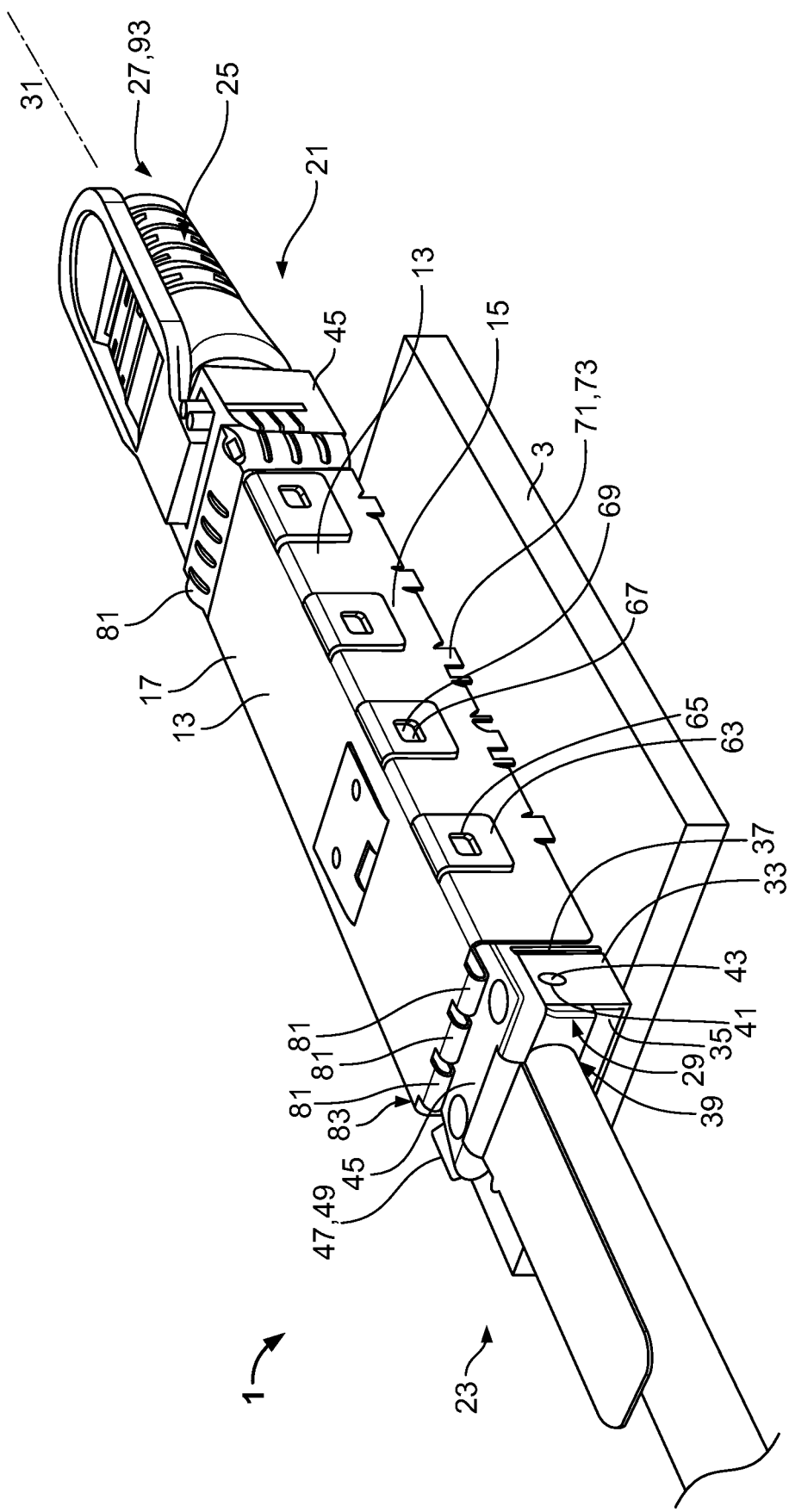
FIG. 5 is a perspective view of a shielding housing, a mating connector, and an electrical connector according to another embodiment.

The locking mechanism 33 may comprise a plurality of chamfered edges 47, as shown in FIGS. 3 and 5. More particularly, the plurality of chamfered edges 47 may be formed by flaps 49, which obliquely protrude away from the U-shaped projection 35. The chamfered edges 47 are, in an embodiment, configured in such a way that they facilitate the reception of the knobs 43 in their corresponding holes of the at least one pair of holes 41. More particularly, the chamfered edges 47 are configured to facilitate the reception of the knobs 43 in a direction perpendicular to the mating axis 31 and/or in a direction parallel to the mating axis 31.

Figure 7:
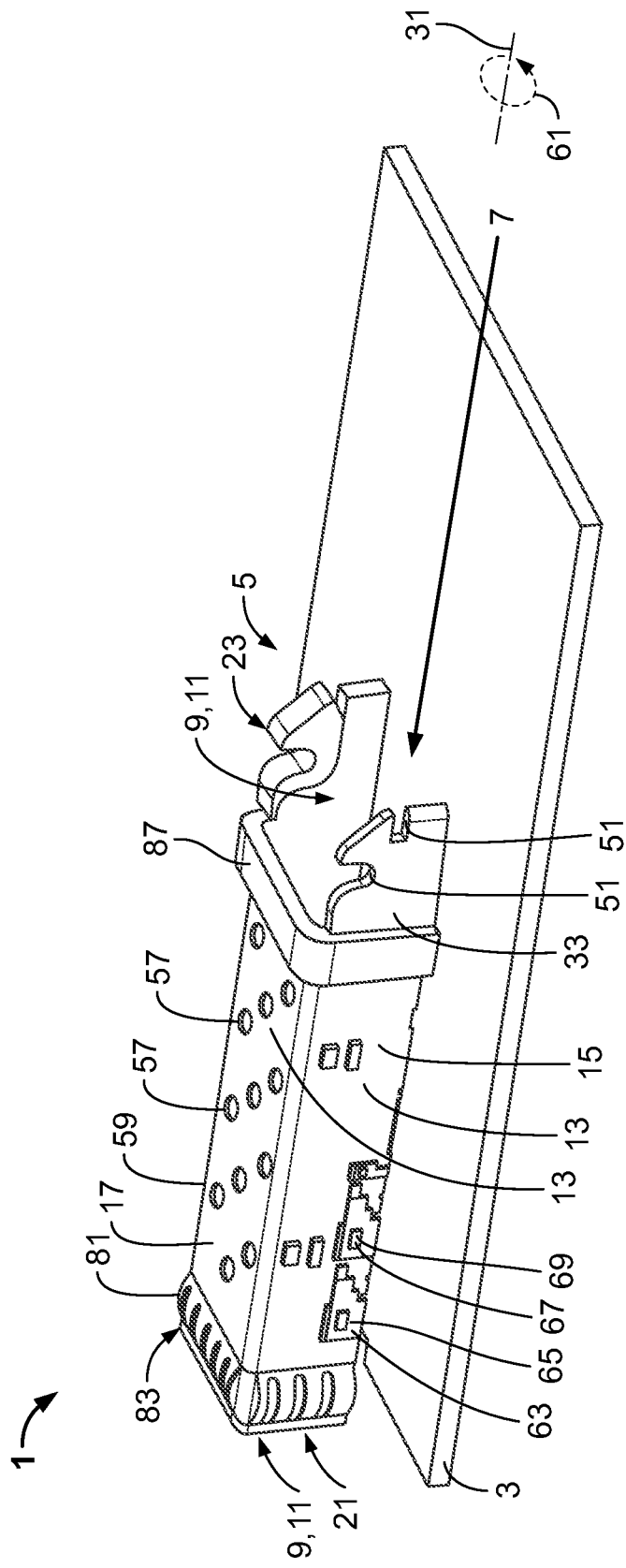
FIG. 7 is perspective view of a portion of the shielding housing of FIG. 6.
Figure 9:
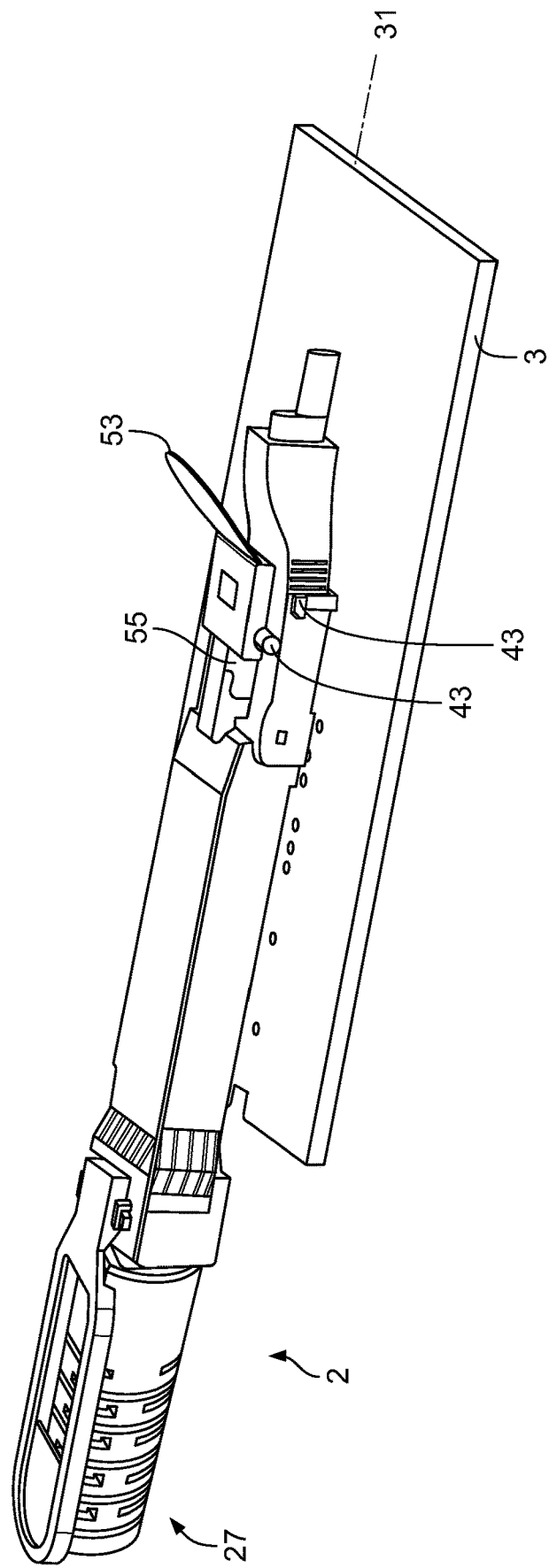
FIG. 9 is a perspective view of a mating connector and an electrical connector without a shielding housing.

In another exemplary embodiment, the U-shaped projection 35 of the locking mechanism 33 may comprise a plurality of grooves 51, as shown in FIGS. 7-9. The grooves 51 may be formed by recesses, which extend from an outer edge of the U-shaped projection 35 along a direction parallel or perpendicular to the mating axis 31. Each groove 51 that extends in a direction parallel to the mating axis 31 may be configured to receive a corresponding knob 43, which is positioned on the outside of the backshell 45 of the mating connector 29. Each groove 51 that extends in a direction perpendicular to the mating axis 31 may be configured to receive a corresponding knob 43, which is positioned on a pull tab 53, the pull tab 53 being connected to the backshell 45 of the mating connector 29 through a pivotable hinge 55.

As shown in FIG. 9, the received electrical connector 25 may be a connector of a direct attach cable (DAC), such as an SFP connector, an SFP+ connector or any other type of small form-factor pluggable connector. In this case, the locking mechanism 33 may be a locking mechanism suitable for holding a small form factor pluggable connector as shown in FIG. 6.

The electrical connector 25 may also be an optical module of a fiber-optic cable, the optical module functioning as a converter for a signal of the fiber-optic cable into a signal of an electrical cable and vice versa. In this case, at least one of the sidewalls 15, the top wall 17 or the bottom wall 19 may comprise a plurality of cooling holes 57, as shown in FIG. 8. The cooling holes 57, in an embodiment, are designed with regards to position, diameter and/or distribution in such a way to prevent penetration of electromagnetic radiation of any anticipated frequencies obstructive to the application. Through the cooling holes 57, thermal energy is better transported from the interior of the shielding housing 1 to the surrounding, thus preventing overheating.

Figure 6:
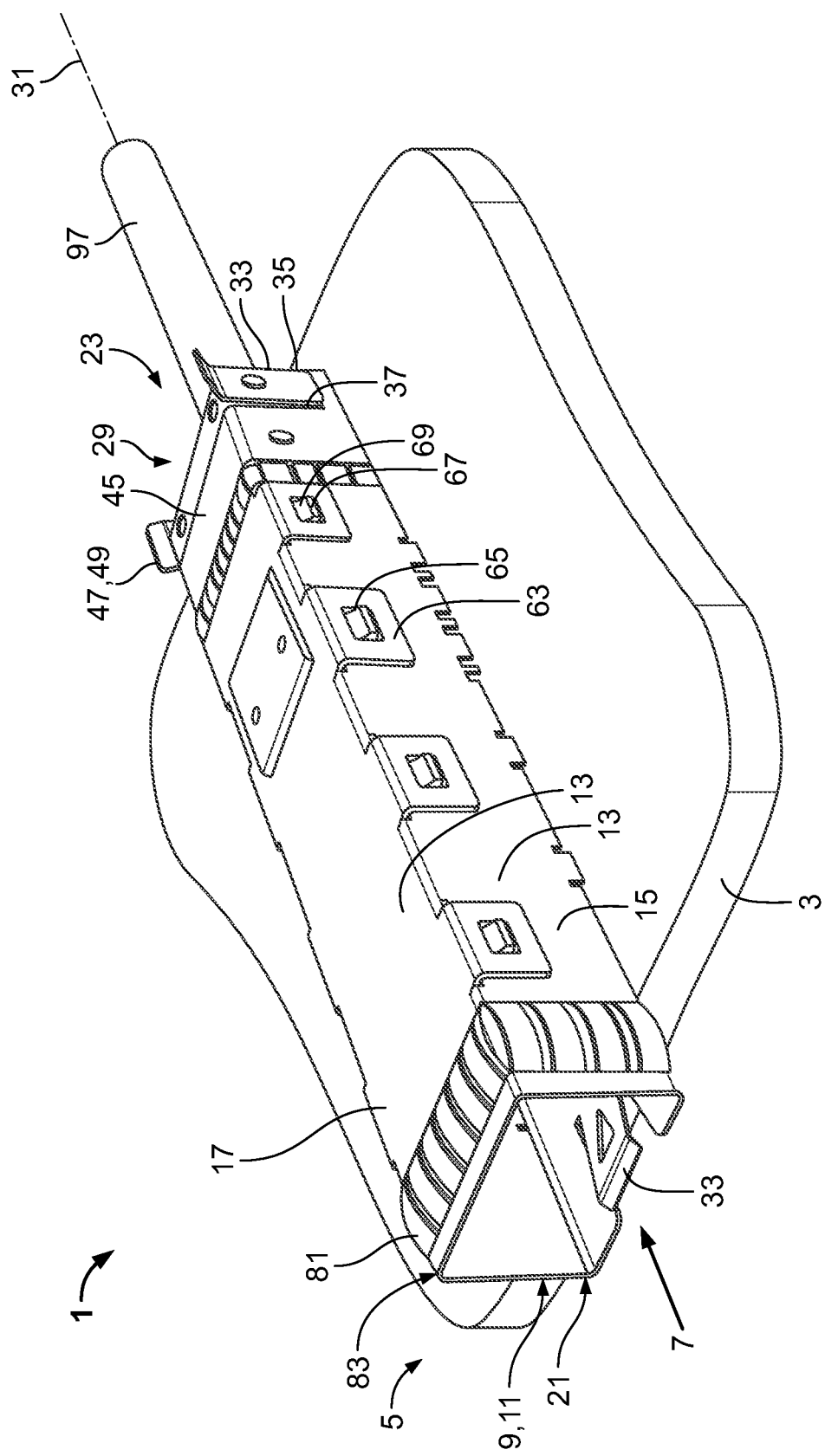
FIG. 6 is a perspective view of a shielding housing according to another embodiment.

In the exemplary embodiment of the shielding housing 1 shown in FIGS. 6-8, the shielding housing 1 may be formed from a single folded sheet 59 that is electrically conductive, which is folded around the receptacle 5, wherein opposite ends with respect to a circumferential direction 61 may be latched together. The electrically conductive property of the sheet 59 may be derived from the usage of an electrically conductive sheet material, the usage of a sheet material containing doped particles and/or the usage of a sheet material, which is coated with an electrically conductive coating.

In an embodiment, the sheet 59 may have at least one latch 63 with a latching groove 65 and a chamfered edge 47. Further, the single folded sheet 59 may comprise at least one surface 67 with a latching cam 69. More particularly, the latching groove 65 and the latching cam 69 are configured to engage in a latching connection, when the single folded sheet 59 is folded around the receptacle 5 of the shielding housing 1. The chamfered edge 47 is configured to facilitate the engagement of the latching connection. Additionally or alternatively, the opposite ends may be engaged with one another through a form fit and/or a positive-locking fit.

Forming the shielding housing 1 from a single folded sheet 59 reduces the number of components constituting the shielding housing 1. Thus, manufacturing of the shielding housing 1 is facilitated. The usage of an electrically conductive material enables the sheet 59 to better reflect electromagnetic radiation, giving the sheet the capability of EMI-shielding as it prevents the penetration of electromagnetic radiation through the sheet 59.

In an exemplary embodiment, the sheet 59, the at least one latch 63 with a latching groove 65, and the at least one surface 67 with a latching cam 69 may be integrally stamped out of an electrically conductive material. Additionally or alternatively, the sheet 59, the at least one latch 63 with a latching groove 65, and the at least one surface 67 with a latching cam 69 may be formed by a magnetically permeable material and/or a material with a shielding efficiency amounting to a predefined value according to the application of the shielding housing 1. The magnetic permeability enables the sheet 59 to better absorb electromagnetic radiation. Thus, the sheet 59 may act as an EMI-shield by preventing the penetration of the electromagnetic radiation through the sheet 59. The sheet 59 and the at least one latch 63 with a latching groove 65 are folded and/or bent around the receptacle 5 of the shielding housing 1 in such a way that the at least one latch 63 with a latching groove 65 is brought into the latching connection with the latching cam 69.

As shown in FIG. 2, the shielding housing 1 may comprise a plurality of attachment elements 71. More particularly, the attachment elements 71 may be a plurality of pins 73, which are configured to be inserted into the PCB 3. In an embodiment, the pins 73 are stamped out of the electrically conductive material as an integral part of the sheet 59. The pins 73 may be bent after the insertion into the PCB 3. The attachment elements 71 fixate the shielding housing 1 on the PCB 3 and absorb mechanical stress, which is imposed on the shielding housing 1 e.g. by external forces pulling on the electrical connector 25. Thus, the attachment elements 71 also protect the shielding housing 1 from mechanical strain.

In another exemplary embodiment as shown in FIG. 2, the shielding housing 1 may be formed from at least two separate parts 75a, 75b. Each separate part 75a, 75b may be formed by an electrically conductive sheet material. Additionally or alternatively, each separate part 75a, 75b may be formed by a magnetically permeable sheet material and/or a sheet material with a shielding efficiency amounting to a predefined value according to the application of the shielding housing 1. In an embodiment, one of the at least two parts 75a, 75b is folded to form a section of the receptacle 5, while the other of the at least two parts 75a, 75b is folded to form a complementary section of the receptacle 5. In an embodiment, one of the at least two parts 75a, 75b has at least one locking mechanism 33. Furthermore, one of the at least two parts 75a, 75b has at least one latch 63 with a latching groove 65 and a chamfered edge 47, while the other of the at least two parts 75a, 75b comprises at least one surface 67 with a latching cam 69, as shown in FIG. 3. In an embodiment, the latching groove 65 and the latching cam 69 are configured to engage in a latching connection, when the at least two parts 75a, 75b are put together to form the receptacle 5. The chamfered edge 47 is configured to facilitate the engagement of the latching connection.

As shown in FIG. 2, the attachment elements 71 are arranged on one of the at least two parts 75a, 75b, and in an embodiment on one of the at least two parts 75a, 75b that has the locking mechanism 33. This allows the part 75a with attachment elements 71 to be attached primarily to the PCB 3, e.g through a first step of a pick and place assembly process. The part 75b without attachment elements 71 may be put onto the part 75a with attachment elements 71 thereafter, e.g through a consecutive step of the pick and place assembly process. More particularly, the at least two parts 75a, 75b may engage in the latching connection thereafter.

Optionally, the mating connector 29 may be placed between the parts 75a, 75b, as shown in FIG. 2. More particularly, the mating connector 29 may be placed into the part 75a with attachment elements 71, e.g. through an intermediate step of the pick and place assembly process, and held by the locking mechanism 33. The locking mechanism 33 may be arranged adjacently to one of the openings 9 of the receptacle 5 and may form a continuation of the straight passage. Providing a locking mechanism 33 prevents an undesired disconnection of the electrical connector 25 and mating connector 29, while also ensuring that the electrical connector 25 and/or mating connector 29 are received in the correct orientation.

Figure 12:
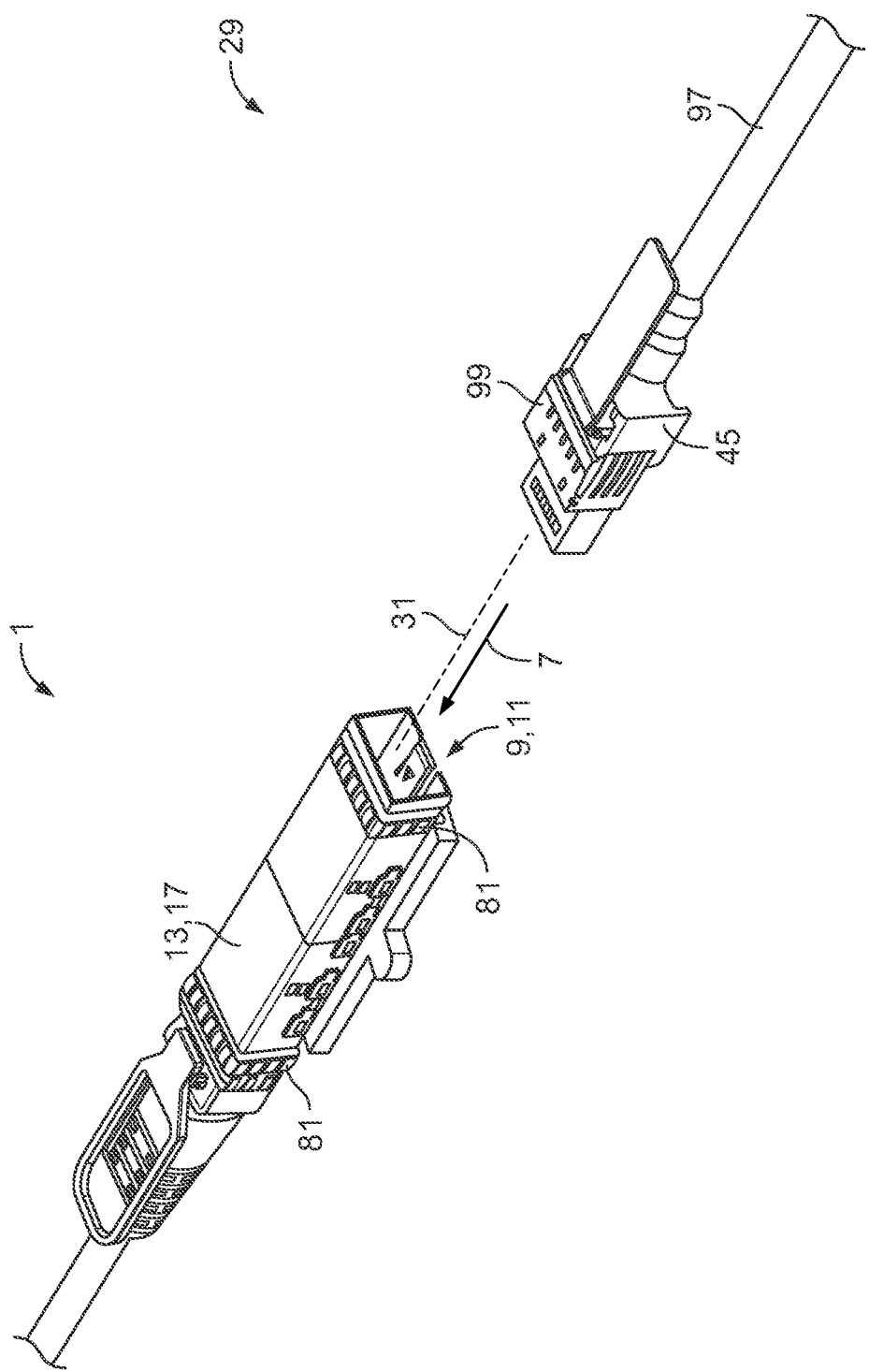
FIG. 12 is a perspective view of a shielding housing, a mating connector, and an electrical connector according to another embodiment.

Thereafter, the part 75b without attachment elements 71 may be put onto the part 75a with attachment elements 71 already holding the mating connector 29. Alternatively, the mating connector 29 may be inserted into the receptacle 5 of the shielding housing 1 after the at least two parts 75a, 75b have already been engaged in the latching connection. In this case, the mating connector 29 is inserted into the receptacle 5 through the opening 9, along a direction parallel to the mating axis 31. FIG. 12 illustrates such an insertion of the mating connector 29 into the receptacle 5 along a direction parallel to the mating axis 31.

Figure 4:
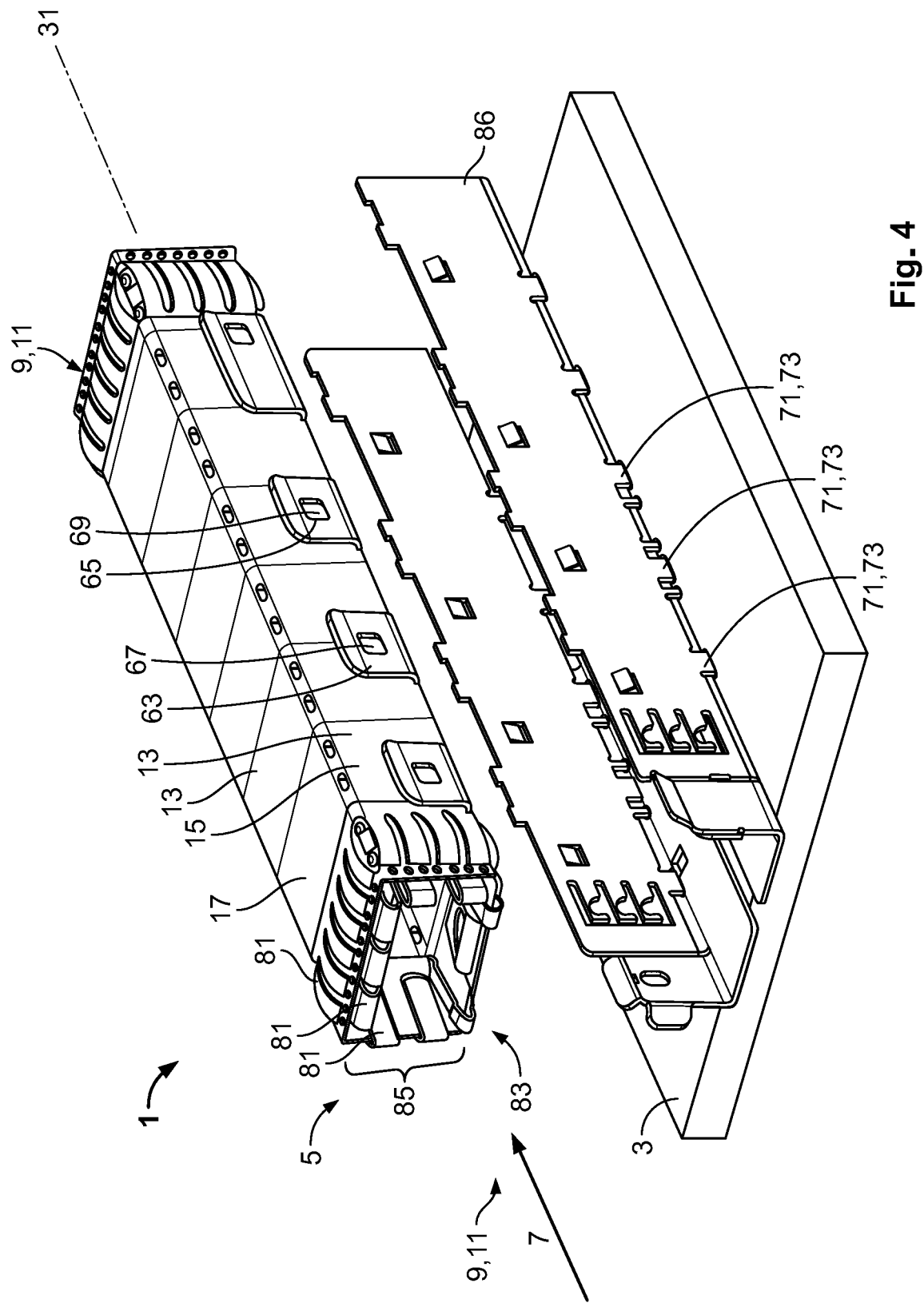
FIG. 4 is a perspective view of a shielding housing according to another embodiment.

In another exemplary embodiment, the shielding housing 1 has at least one spring finger 81 at at least one of the openings 9 as shown in FIGS. 4 and 5. The at least one spring finger 81, in an embodiment, is elastic and bent in a direction perpendicular to the mating axis 31. Moreover, the at least one spring finger 81 is further bent backwards into one of the openings 9 and towards the respective opposite opening. The at least one spring finger 81 is configured to create a mechanical bias against the mating connector 29, which is received in the receptacle 5. This allows the positioning and fixation of the mating connector 29. Furthermore, the at least one spring finger 81 is configured to engage in electrical contact with the mating connector 29. More particularly, the at least one spring finger 81 is configured to provide an electrical link between the shielding housing 1 and the backshell 45 of the mating connector 29, thus providing a seamless electromagnetic interference (EMI)-shielding. Thus, cross-talk suppression is improved and the risk of EMI is lowered. In an embodiment, a plurality of spring fingers 81 is arranged around the periphery 83 of at least one of the openings 9. More particularly, more than one spring finger 81 is arranged at one side 85 of the receptacle 5.

Additionally, the at least one spring finger 81 may be bent outwards away from one of the openings 9 and towards the respective opposite opening 9. Alternatively, the at least one spring finger 81 may be bent backwards into one of the openings 9 and towards the respective opposite opening 9. The outwards bent spring finger 81 may be configured to create electrical contact with a front panel positioned on the edge of the PCB 3. The inwards bent spring finger 81 may be configured to create electrical contact with the backshell 45 of the received connector 29. In yet another embodiment, the at least one spring finger 81 may protrude away from the receptacle 5 along the direction of the mating axis 31.

In another embodiment, the shielding housing 1 may comprise a plurality of such spring fingers 81 arranged around the periphery of at least one of the openings 9. A higher quantity of spring fingers 81 may provide a larger total cross-section to conduct electrical currents through the electrical contact between the spring fingers 81 and the backshell 45 of the received connector 29. Having more than one spring finger 81 arranged at one side 85 of the openings 9 may reduce the size of the slits between the shielding housing 1 and the backshell 45 of the received connector 29, the slits being a cause for leakage of electromagnetic radiation.

In an exemplary embodiment, the shielding housing 1, the attachment elements 71, e.g. the pins 73, and the at least one spring finger 81 is stamped out of the same sheet material, wherein after the stamping the at least one spring finger 81 is folded and/or bent backwards into one of the openings 9 and towards the respective opposite opening. Additionally or alternatively, at least one other spring finger 81 may be formed by a separate sheet material and may be welded onto the shielding housing 1, as shown in FIG. 4.

As can also be seen in FIG. 4, the shielding housing 1 may comprise an adapter 86, such as a metallic support, as a separate component. The adapter 86 may have the attachment elements 71 or the pins 73. The adapter 86 may further be configured for attachment to the PCB 3 via the attachment elements 71. In addition, the adapter 86 may be configured to engage into a form-fit connection with the shielding housing 1. In particular, the shielding housing 1 may be secured by the adapter 86 through a latching mechanism (not shown). By positioning the attachment elements 71 on a separate component (i.e. the adapter 86), the shielding housing 1 may be designed in a more compact, closed manner with fewer holes. The shielding housing 1 may also be attached to any other type of adapter or suitable support structure, e.g. on a bulkhead or in a chamber.

As an addition or alternative to the spring fingers 81, a gasket 87 may be attached at at least one of the openings 9, as shown in FIG. 7, wherein the gasket 87 at least partly surrounds the periphery 83 of that opening 9 and is made of a material that has an electrically conductive property, a magnetically permeable property and/or a shielding efficiency amounting to a predefined value according to the application of the shielding housing 1.

Figure 11:
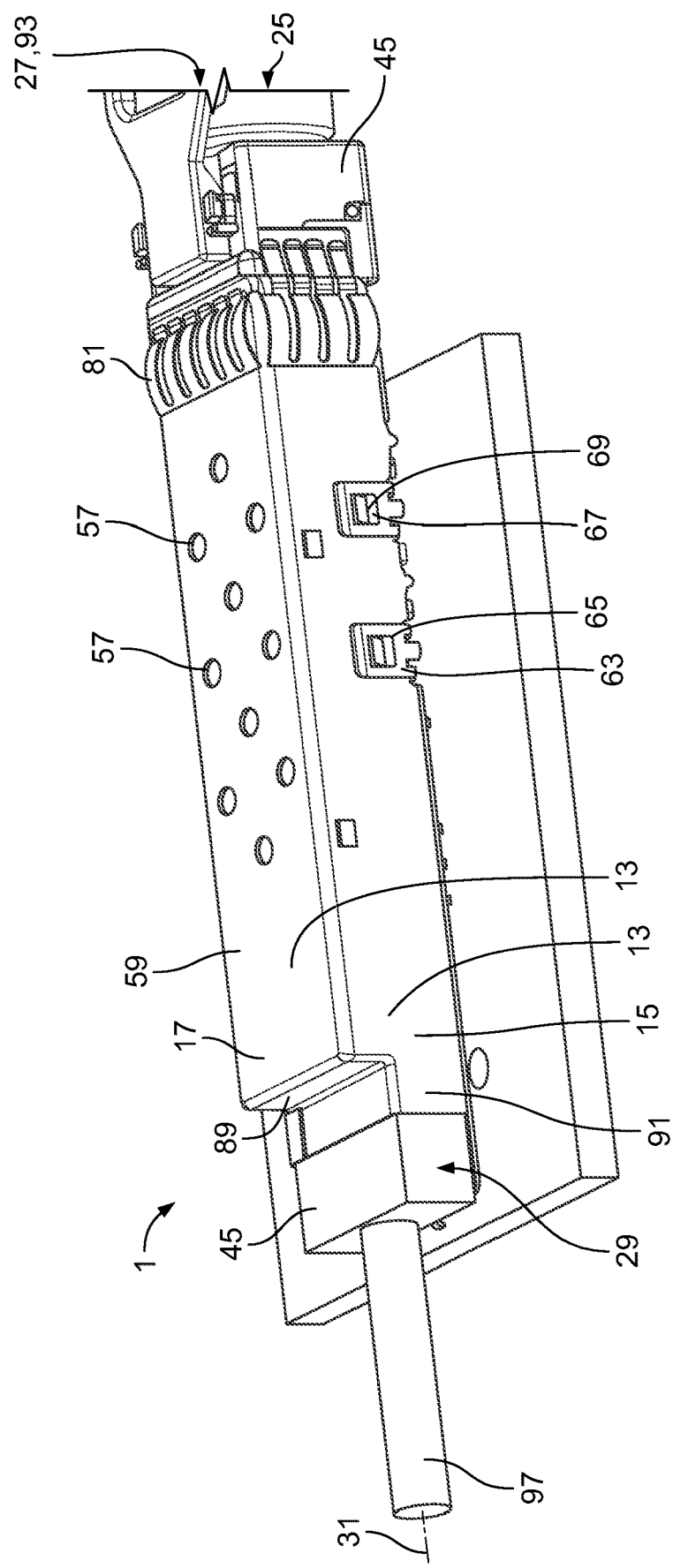
FIG. 11 is a perspective view of a shielding housing, a mating connector, and an electrical connector according to another embodiment.

FIG. 11 shows yet another possible embodiment of the shielding housing 1, wherein one opening 9 has a cross-sectional area perpendicular to the mating axis 31 that is smaller than the cross-sectional area perpendicular to the mating axis 31 of the other opening 9. The difference in the cross-sectional area is covered by the shielding housing 1. More particularly, the shielding housing 1 has at one opening 9 a shoulder 89. The shoulder 89 is formed by a section of the folded sheet 59, which is folded in such a way that it faces in the direction of the mating axis 31 and partly covers the opening 9 with the smaller cross-sectional area. From the opening 9 with the smaller cross-sectional area, a protrusion 91 may form a continuation of the straight passage 7. The protrusion 91 may also be configured to receive one of the connectors (i.e. the electrical connector 25 or the mating connector 29).

As shown in FIG. 5, the shielding housing 1 may be part of a cable assembly 93, such as an internal cable assembly of a high-speed bypass connection. The cable assembly 93 may further comprise at least the electrical connector 25 and/or the mating connector 29. The electrical connector 25 and/or the mating connector 29 may be at least partly received in the shielding housing 1. More particularly, the shielding housing 1 may seamlessly shield at least the received parts of the electrical connector 25 and/or the mating connector 29 from EMI, when the electrical connector 25 and/or the mating connector 29 is received in the shielding housing 1. Additionally, the corresponding other connector may be received individually in the shielding housing 1 and mated with the already received electrical connector 25 or mating connector 29, respectively. In this case, the shielding housing 1 may provide seamless EMI-shielding for the entire combined length of the received electrical connector 25, the shielding housing 1 and the received mating connector 29. The shielding housing 1 according to the embodiments described herein improves the cable assembly 93 in terms of cross-talk suppression and to generally lower the risk of EMI.

Figure 10:
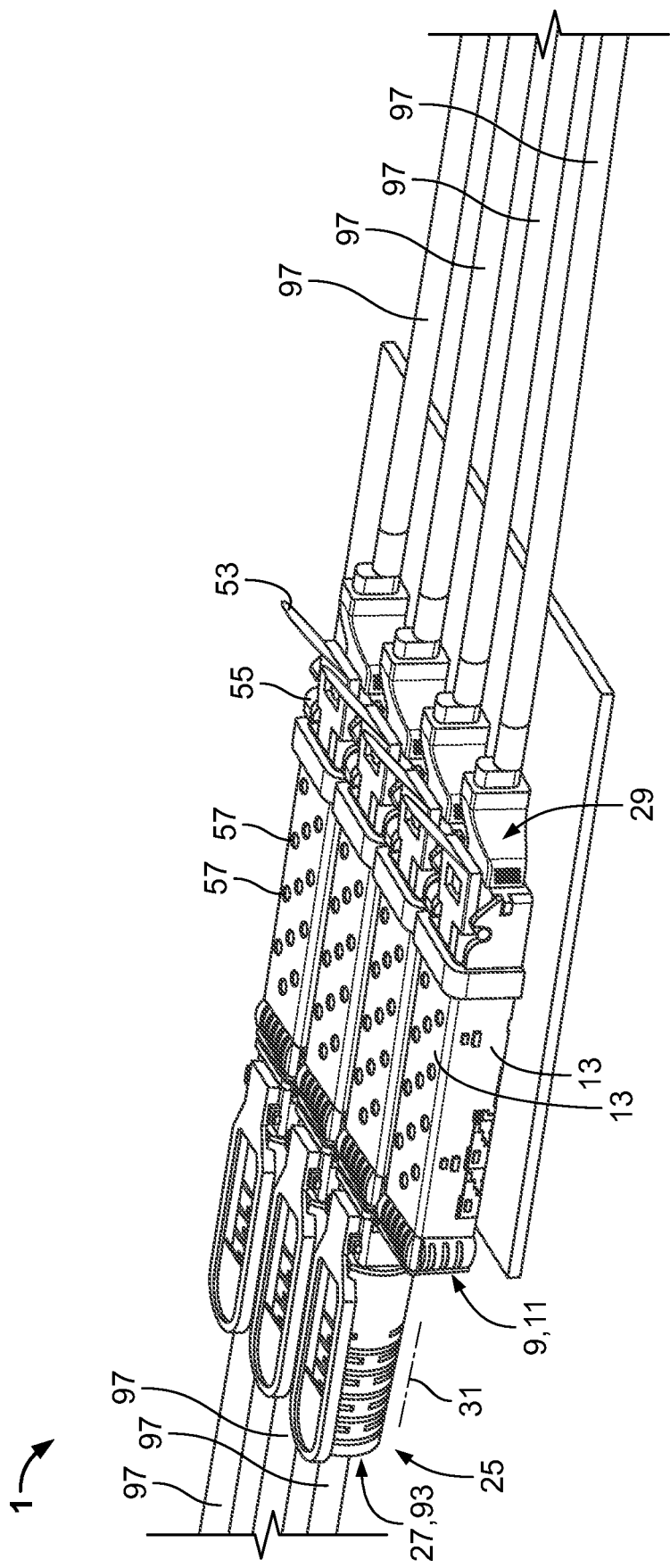
FIG. 10 is a perspective view of a cable assembly with a plurality of shielding housings, mating connector, and electrical connectors of FIG. 8.

In one exemplary embodiment of the cable assembly 93 shown in FIG. 10, the cable assembly 93 may comprise a plurality of shielding housings 1, wherein each shielding housing 1 is configured to receive a separate electrical connector assembly 27, comprising at least an electrical connector 25 and/or a mating connector 29, respectively.

In any of the above-mentioned embodiments, the cable assembly 93 may further comprise a shielded cable 97 extending from at least one of the connectors (i.e. the electrical connector 25 and/or the mating connector 29). In an embodiment, one shielded cable 97 extends from each electrical connector 25 and mating connector 29, as shown in FIG. 10. In this case, the cable assembly 93 may be seamlessly shielded from EMI along its entire combined length.

In any of the above-mentioned embodiments of the cable assembly 93, at least one electrical connector 25 and/or mating connector 29 is detachable from the shielding housing 1. In an embodiment, all the electrical connectors 25 and all the mating connectors 29 are detachable from the shielding housing 1.

At least one electrical connector 25 and/or mating connector 29 may comprise at least one backshell 45. The backshell 45 may be a die cast backshell 45, a plated plastic backshell 45, or a formed metal backshell 45. Each backshell 45 is configured to be securely held by a corresponding locking mechanism 33. Furthermore, each backshell 45 is configured to engage in electric contact with the at least one spring finger 81 and/or the gasket 87. As shown in FIG. 2, the backshell 45 may additionally or alternatively comprise at least one spring finger 99, preferably a plurality of spring fingers 99, for this purpose.

What is claimed is:

1. A shielding housing, comprising:
a receptacle configured to receive an electrical connector assembly including an electrical connector and a mating connector connected to the electrical connector, the receptacle is formed as a straight passage defined by a top wall, a bottom wall, and two sidewalls extending therebetween with an opening at each end of the straight passage, either end of the straight passage receives one of the electrical connector and the mating connector along a mating axis coaxial with the straight passage, the receptacle further including a locking mechanism arranged at an end thereof and defining openings formed in areas of the two sidewalls not covered by the top wall for receiving a portion of one of the electrical connector or the mating connector.

2. The shielding housing of claim 1, wherein the electrical connector is a high-speed electrical connector.

3. The shielding housing of claim 1, wherein the shielding housing is formed from a single electrically conductive sheet folded around the receptacle, opposite ends of the single folded sheet with respect to a circumferential direction are latched together, the circumferential direction extending around the receptacle.

4. The shielding housing of claim 1, wherein the shielding housing is formed from a pair of parts, each part being formed by an electrically conductive sheet material.

5. The shielding housing of claim 1, further comprising a plurality of attachment elements configured to be inserted into a circuit board.

6. The shielding housing of claim 1, further comprising a spring finger at the opening of the straight line passage opposite the locking mechanism, the spring finger is elastic and bent in a direction perpendicular to the mating axis.

7. The shielding housing of claim 6, wherein a plurality of spring fingers are arranged around a periphery of the opening.

8. The shielding housing of claim 6, wherein at least one of the spring fingers is bent backwards into the opening.

9. The shielding housing of claim 6, wherein at least one of the spring fingers protrudes away from the receptacle along the mating axis.

10. The shielding housing of claim 6, wherein at least one of the spring fingers and a plurality of attachment elements configured to be inserted into a circuit board are stamped out of a same sheet material.

11. The shielding housing of claim 1, wherein one of the openings has a cross-sectional area perpendicular to the mating axis that is smaller than a cross-sectional area perpendicular to the mating axis of the other opening.

12. The shielding housing of claim 11, wherein a difference in the cross-sectional area of the one of the openings is covered by the shielding housing.

13. The shielding housing of claim 1, wherein the openings of the locking mechanism include a plurality of grooves formed in each sidewall.

14. The shielding housing of claim 1, wherein each of the sidewalls define a slit formed therethrough separating the locking mechanism from a remainder of each sidewall.

15. The shielding housing of claim 14, wherein the bottom wall defines a slit extending in the direction of the mating axis for separating the locking mechanism into two halves.

16. A cable assembly, comprising:
a shielding housing having a receptacle configured to receive an electrical connector assembly including an electrical connector and a mating connector connected to the electrical connector, the receptacle is formed as a straight passage with an opening at each end of the straight passage, either end of the straight passage receives one of the electrical connector and the mating connector along a mating axis coaxial with the straight passage; and
an adapter including:
a bottom wall and two sidewalls, the shielding housing received within the adapter between the two sidewalls;
a plurality of attachment elements for mechanically fixing the adapter to a circuit board; and
a locking mechanism arranged at an end of the adapter and defining openings formed through the two sidewalls for fixing one of the electrical connector or the mating connector to the adapter.

17. The cable assembly of claim 16, wherein the electrical connector and the mating connector are at least partly received in the shielding housing.

18. The cable assembly of claim 16, wherein the shielding housing includes a plurality of spring fingers arranged around a periphery of each opening of the straight line passage.

19. A cable assembly, comprising:
a first shielded cable having a free end directly attached to an electrical connector;
a second shielded cable having a free end directly attached to a mating connector, the electrical connector and the mating connector directly connected to one another for passing electrical signals between the first shielded cable and the second shielded cable; and
a shielding housing having a receptacle receiving the electrical connector and the mating connector connected to the electrical connector, the receptacle is formed as a straight passage with an opening at each end of the straight passage, either end of the straight passage receives one of the electrical connector and the mating connector along a mating axis coaxial with the straight passage, the shielding housing seamlessly shields the electrical connector and the mating connector from electromagnetic interference along an entire combined length of connected portions of the electrical connector and the mating connector, the receptacle further including a locking mechanism arranged at an end thereof, the locking mechanism defining openings formed in two sidewalls of the shield housing receiving a portion of one of the electrical connector or the mating connector, the shielding housing formed from a single electrically conductive sheet folded around the receptacle, opposite ends of the single folded sheet with respect to a circumferential direction are latched together.

20. The cable assembly of claim 19, wherein the shielding housing includes a plurality of spring fingers arranged around a periphery of a first end of the straight line passage and a locking mechanism arranged at a second end of the straight line passage for fixing one of the electrical connector or the mating connector to the shielding housing.

21. The cable assembly of claim 20, wherein the locking mechanism defines a plurality of openings configured to receive corresponding protrusions of the electrical connector or the mating connector.

* * * * *